United States Patent [19]

Stepan

[11] Patent Number: 4,580,857

[45] Date of Patent: * Apr. 8, 1986

[54] CIRCUIT TERMINATING CLIP

[75] Inventor: William E. Stepan, Clarendon Hills, Ill.

[73] Assignee: GTE Communication Systems Corporation, Phoenix, Ariz.

[*] Notice: The portion of the term of this patent subsequent to Mar. 11, 2003 has been disclaimed.

[21] Appl. No.: 660,347

[22] Filed: Oct. 12, 1984

[51] Int. Cl.4 .............................................. H01R 9/09
[52] U.S. Cl. ................................................ 339/17 LC
[58] Field of Search ................. 339/17 R, 17 C, 17 L, 339/17 LC, 17 LM, 17 M, 17 N, 275 B, 258 R, 258 P; 361/393, 412–414, 405

[56] References Cited

U.S. PATENT DOCUMENTS

| 2,760,176 | 8/1956 | Del Camp | 339/17 D |
| 2,875,264 | 2/1959 | Gross | 361/405 |
| 3,270,251 | 8/1966 | Evans | 339/17 LM |
| 3,579,170 | 5/1971 | Baumanis et al. | 339/91 R |
| 3,611,249 | 10/1971 | Lovrenich | 339/17 R |
| 3,805,117 | 4/1974 | Hausman | 361/412 |
| 4,025,162 | 5/1977 | Yagi | 339/17 M |

FOREIGN PATENT DOCUMENTS 675634 8/1979 U.S.S.R. .......................... 339/275 B

OTHER PUBLICATIONS

IBM Bulletin, Pavlik et al., vol. 20, No. 9, p. 3401, 2-1978.

Primary Examiner—Neil Abrams
Attorney, Agent, or Firm—Anthony Miologos; Peter Xiarhos

[57] ABSTRACT

A circuit terminating clip for mechanically retaining and electrically connecting a planer substrate such as a thick/thin film circuit to a printed wiring card. The terminating clip is characterized by a terminating body having planer sidewalls defining a hollow interconnecting post receiving area therebetween. A substrate spring member extends from a bottom edge of a front wall of the terminating body arranged to accept the edge of the substrate, connecting the substrate to the terminating body. A terminating pad member extending from the top edge of the front wall of the terminating body is soldered to the substrate retaining the terminating body to the substrate. Post spring members extending inwardly into the post receiving area engage an interconnection post which extends from the printed wiring card thereby retaining the terminating body to the printed wiring card.

3 Claims, 3 Drawing Figures

CIRCUIT TERMINATING CLIP

CROSS-REFERENCE TO RELATED APPLICATIONS

The present application is related to co-pending U.S. Patent Application Ser. No. 660,346 titled "A Circuit Terminating Device" and U.S. patent application Ser. No. 660,348 titled "A Circuit to Post Interconnection Device", both having the same inventive entity and being assigned to the same assignee.

BACKGROUND OF THE INVENTION

This invention relates in general to electrical interconnection devices and more particularly to a device for providing electrical connections between planer circuits such as thick/thin film hybrid and printed wiring cards.

Typically, electrical connections to thick/thin film hybrid circuits are made through wires or terminal devices. These terminal devices are soldered onto a hybrid circuits edge with an opposite end plugged into a socket or more likely, into holes in a printing wiring card (PWC). When inserted into PWC holes, the connections are soldered to insure good mechanical and electrical connections. This method finds disadvantage in that the replacement of defective hybrid circuits is obviously difficult and sometimes damaging to the entire PWC assembly.

Still another method of making such interconnections is the use of sockets on the PWC which accept hybrid terminal devices as a plug in module. This method also finds disadvantage in that it adds significantly to the cost of the assembly. Further, the hybrid terminals are usually not designed as pluggable contacts and can become damaged through careless insertion. Finally, the possibility exists that the socket receptacles on the PWC can become damaged making the entire PWC assembly unusable.

It has become increasingly popular in the industry in recent years to use square or rectangular metallic posts as an interconnection member. Such posts are pressed into holes in a PWC, with the electrical connection between the posts and the PWC made by either intimate contact or with the aid of a solder connection. Various means can be used to interconnect one PWC to another or a PWC to a thick/thin hybrid circuit. These interconnection means can range from the use of receptacles made for this purpose or the use of wire wrapping.

Presently known receptacles require one or more holes in the PWC substrate for attachment. This finds disadvantage however in thick/thin film hybrids since they are usually made out of a ceramic substrate and usually are economically impractical to include holes.

Accordingly, it is the object of the present invention to provide a circuit terminating device for interconnecting planer circuits such as thick/thin film hybrid circuits to a PWC in an effective and economical manner.

SUMMARY OF THE INVENTION

In accomplishing the object of the present invention there is provided a circuit terminating clip for mechanically retaining and electrically connecting a planer substrate to a printed wiring card. The planer substrate includes at least a first and a second termination pad located oppositely from each other and adjacent one edge of the substrate. The printed wiring card includes at least one interconnection post extending perpendicularly from a top surface of the printed wiring card.

The terminating clip of the present invention is characterized by a generally rectangular terminating body having a pair of planer sidewalls and a planer front and rear wall defining a hollow interconnecting post receiving area therebetween. Each of the sidwalls includes a post spring member which extends inwardly into the post receiving area. The post receiving area is arranged to accept substantially therein the printed wiring card interconnection post. Each post spring member engages and exerts a compressive force on the interconnection post, mechanically retaining and electrically connecting the terminating body to the interconnection post.

A S-shaped substrate spring member extends from a bottom edge of the front wall of the terminating body. The substrate spring member includes a contact surface defining a substrate accepting area between the contact surface and the front wall. The substrate accepting area is arranged to compressively accept the edge of the substrate therebetween with the contact surface engaging the first termination pad.

A terminating pad member extending outward from the top edge of the front wall of the terminating body is arranged to be soldered to the second terminating pad thereby mechanically retaining and electrically connecting the substrate to the terminating body.

DESCRIPTION OF THE PREFERRED EMBODIMENT

Figure 1:
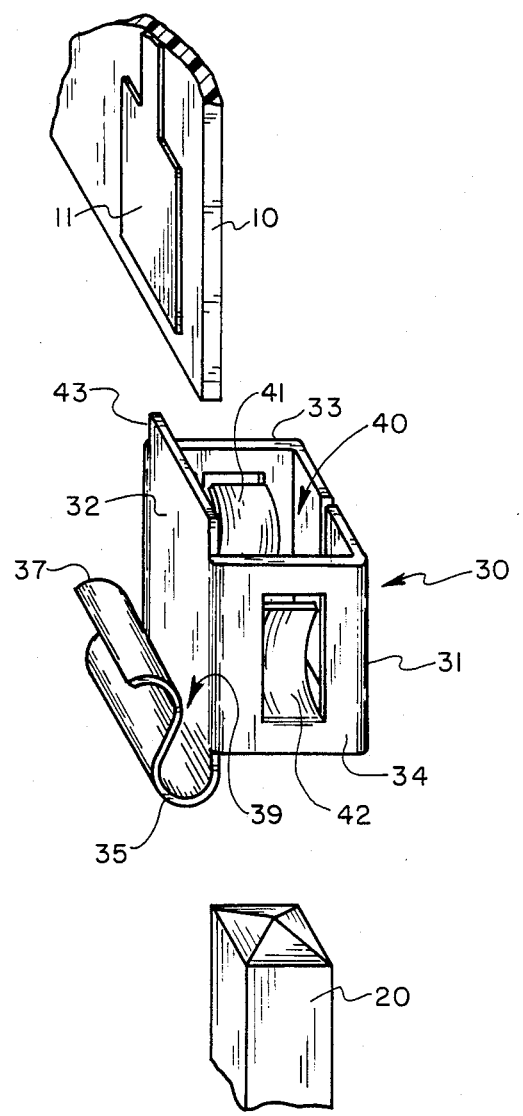
FIG. 1 is a perspective view of the device of the present invention.

Turning now to FIG. 1, the present invention is characterized by a rectangular terminating clip body shown generally as 30 and having a vertical back wall 31, front wall 32, and sidewalls 33 and 34. Walls 31–34 define a post receiving area 41, extending through body 30, arranged to accept a square interconnection post 20 therein. Post spring members 41 and 42 extend inward into receiving area 41 from walls 33 and 34 respectively, and exert a compressive force on interconnection post 20, providing a compressive fit of body 30 on post 20.

An S-shaped substrate spring member 35 extends outward of the bottom edge of front wall 32. Surface 37 of substrate spring members 35 and front wall 32 define a substrate accepting area 39 therebetween arranged to accept an edge of a planer substrate 10. A metalized termination pad 11 on substrate 10 has a compressive force applied to it by substrate spring member surface 37 providing an intimate mechanical connection as well as an electrical connection between substrate 10 and terminating clip body 30.

The terminating clip of the present invention is stamped out of and formed from a phosphor bronze material exhibiting good conductive qualities.

Figure 2:
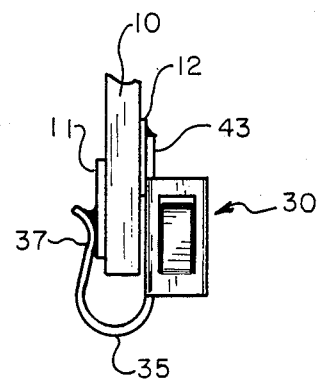
FIG. 2 is an elevational view illustrating the attachment of the device of the present invention to a planer substrate.
Figure 3:
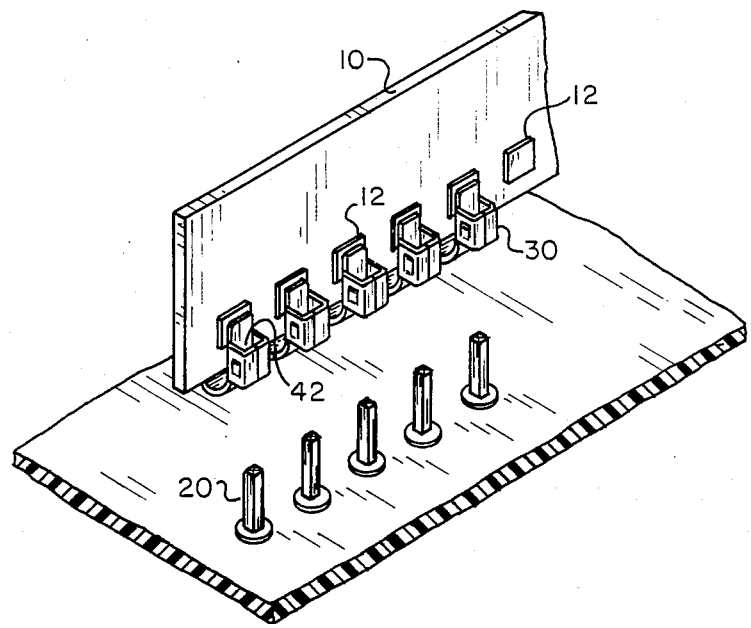
FIG. 3 is a perspective view illustrating the use of the device of the present invention for interconnecting a planer substrate to a PWC.

Turning now to FIGS. 2 and 3, an example of the intended use of the device of the present invention is illustrated. As can be seen in FIG. 2 body 30 is installed on substrate 10 with substrate spring member surface 37 contacting pad 11. Surface 37 is fixedly retained to pad 11 by the application of solder. A second metalized pad 12 opposite pad 11 receives tab 43 which extends outward of surface 32 of terminating clip body 30. Tab 43 is also fixedly retained to pad 12 by the application of solder, completing the attachment of the terminating clip to substrate 10.

Turning to FIG. 3, a printed wiring card (PWC) 50 has a plurality of interconnection posts 20 affixed to PWC 50 by soldering each post 20 to a respective one of holes 51. The substrate 10 with the attached terminating clips is mounted to posts 20 by sliding each post into a respective post receiving area 41 of each terminating clip. A compressive force applied by post spring members 41 and 42 mechanically retains as well as electrically connects each terminating clip to its respective post.

It will be appreciated by those skilled in the art that the present invention has advantages in the mounting of thick/thin film hybrid circuits to printed wiring boards over the prior art devices. These advantages include the replacing of defective hybrid circuits and the placing of the hybrids over existing components on a PWC without making those components inaccessible if replacement is necessary.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. A circuit terminating clip for mechanically retaining and electrically connecting a planer substrate including at least a first and a second termination pad located oppositely from each other and adjacent one edge of said substrate, and a printed wiring card including at least one interconnection post extending perpendicularly from a top surface of said printed wiring card, said circuit terminating clip comprising:

a generally rectangular terminating body having a pair of planer sidewalls and a planer front and rear wall defining a hollow interconnection post receiving area therebetween, each of said sidewalls including a post spring member extending inwardly from each respective sidewall into said post receiving area and said post receiving area arranged to accept substantially therein said interconnection post with each post spring member engaging and exerting a compressive force on said interconnection post, mechanically retaining and electrically connecting the terminating body to said interconnection post;

a S-shaped substrate spring member extending from the bottom edge of said front wall of said terminating body, said substrate spring member including a contact surface defining a substrate accepting area between said contact surface and said front wall arranged to compressively accept said edge of said substrate therebetween, with said contact surface engaging said first termination pad; and a terminating tab member extending outward from a top edge of said front wall of said terminating body, said terminating tab member solderable to said second termination pad mechanically retaining and electrically connecting said substrate to said terminating body.

2. A circuit terminating clip as claimed in claim 1, wherein: said circuit terminating clip is formed as a one-piece unit of electrically conductive material.

3. A circuit terminating clip as claimed in claim 1, wherein: said terminating body is fixedly retained to said first termination pad by the application of solder to said substrate spring member contact surface and said first termination pad.

* * * * *